(12) United States Patent
Kumar et al.

(10) Patent No.: US 9,201,127 B2
(45) Date of Patent: Dec. 1, 2015

(54) APPARATUS FOR AUTOMATICALLY TESTING AND TUNING RADIO FREQUENCY COIL

(75) Inventors: Santosh Kumar, Bangalore (IN);
Prasidh Ramabadran, Bangalore (IN);
Rohit Parakh, Bangalore (IN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 661 days.

(21) Appl. No.: 13/290,493

(22) Filed: Nov. 7, 2011

(65) Prior Publication Data

US 2013/0113484 A1   May 9, 2013

(30) Foreign Application Priority Data

Nov. 26, 2010   (IN) .......................... 3587/CHE/2010

(51) Int. Cl.
*G01R 33/36* (2006.01)
*G01R 33/58* (2006.01)

(52) U.S. Cl.
CPC ........ *G01R 33/3628* (2013.01); *G01R 33/3657* (2013.01); *G01R 33/583* (2013.01)

(58) Field of Classification Search
CPC ............. G01R 33/3628; G01R 33/583; G01R 33/3657
See application file for complete search history.

(56) References Cited

U.S. PATENT DOCUMENTS

| | | | | |
|---|---|---|---|---|
| 4,820,985 A | | 4/1989 | Eash | |
| 5,057,778 A | * | 10/1991 | Rath | 324/322 |
| 5,432,449 A | * | 7/1995 | Ferut et al. | 324/318 |
| 5,551,430 A | * | 9/1996 | Blakeley et al. | 600/410 |
| 5,557,247 A | * | 9/1996 | Vaughn, Jr. | 333/219 |
| 5,886,596 A | * | 3/1999 | Vaughan, Jr. | 333/219 |
| RE36,495 E | * | 1/2000 | Blakeley et al. | 600/410 |
| 6,054,858 A | | 4/2000 | Dumoulin et al. | |
| 6,384,603 B2 | * | 5/2002 | Hoult et al. | 324/318 |
| 6,396,271 B1 | | 5/2002 | Burl et al. | |
| 7,081,752 B2 | * | 7/2006 | Skloss et al. | 324/318 |
| 7,088,098 B1 | * | 8/2006 | Lynch et al. | 324/307 |
| 7,173,423 B2 | * | 2/2007 | Buchwald et al. | 324/318 |
| 7,215,120 B2 | * | 5/2007 | Vaughan | 324/318 |
| 7,345,483 B2 | * | 3/2008 | Vaughan | 324/318 |
| 7,375,527 B2 | * | 5/2008 | Vaughan, Jr. | 324/318 |
| 7,659,719 B2 | * | 2/2010 | Vaughan et al. | 324/318 |
| 8,013,609 B2 | * | 9/2011 | Vartiovaara | 324/322 |
| 8,633,706 B2 | * | 1/2014 | Possanzini et al. | 324/546 |

OTHER PUBLICATIONS

Venook, R., et al. "Automatic Varactor Tuning of Interventional RF Receiver Coils." Proc. Intl. Soc. Mag. Reson. Med. 11 (2003).

* cited by examiner

*Primary Examiner* — Dixomara Vargas
(74) *Attorney, Agent, or Firm* — GE Global Patent Operation; Marc A. Vivenzio

(57) ABSTRACT

In one embodiment, an apparatus for automatically testing and tuning a RF coil is provided. The apparatus comprises a digital frequency generator for generating a stimulus, the stimulus comprising a range of radio frequency signals having different frequencies, a radio frequency coupler configured for applying the stimulus to the RF coil so as to enable the RF coil to generate a reflected signal in response to the stimulus applied, a radio frequency detector for detecting the reflected signal and a signal processing unit for processing the reflected signal, so as to identify the tuned resonant frequency of the RF coil and further configured for calculating return loss at the RF coil based on the reflected signal.

15 Claims, 6 Drawing Sheets

APPARATUS FOR AUTOMATICALLY TESTING AND TUNING RADIO FREQUENCY COIL

FIELD OF INVENTION

The invention generally relates to a magnetic resonance imaging system and more particularly to RF coils that are used in a magnetic resonance imaging system.

BACKGROUND OF THE INVENTION

The radio frequency (RF) field that is intended to be sensed by an RF coil in a magnetic resonance imaging (MRI) system is of near nature i.e. the distance between the RF transmitter and the RF receiver is less than the wavelength of the signal that is to be sensed. The MRI system comprises an opening referred to herein as bore that receives the object that is to be imaged. Further, the MRI system comprises an RF shield around the bore, which influences the resonant frequency of the RF coil depending on the diameter of the bore and the distance of the RF coil from the center of the bore. For example, an RF coil tuned for a certain resonant frequency in a bore having a diameter of 60 cm exhibits a different resonant frequency in a bore having a diameter of 70 cm due to variation in the distance between the RF coil and the RF shield.

The RF coil comprises an inductive element and a capacitive element. The value of the inductive element is fixed and therefore in order to achieve tunability, the capacitive elements in the RF coil comprise combinations of fixed and mechanically variable capacitors.

Conventionally, the RF coils are tuned in an iterative manner, initially without load, then with load, and then in an RF shield simulator, by manually adjusting one or more tuning knobs of the variable capacitor.

Further, testing of an RF coil involves measuring return loss i.e, logarithmic equivalent of reflection coefficient of the RF coil and transmit signal decoupling between the RF transmitter and the RF receiver. This is a repetitive and time-consuming process, which is performed manually.

Hence there exists a need for a system and method for performing testing and tuning of the RF coils used in the MRI system, which is automatic, efficient and reliable.

BRIEF DESCRIPTION OF THE INVENTION

The above-mentioned shortcomings, disadvantages and problems are addressed herein which will be understood by reading and understanding the following specification.

In one embodiment, an apparatus for automatically testing and tuning a RF coil is provided. The apparatus comprises a digital frequency generator for generating a stimulus, the stimulus comprising a range of radio frequency signals having different frequencies, a radio frequency coupler configured for applying the stimulus to the RF coil so as to enable the RF coil to generate a reflected signal in response to the stimulus applied, a radio frequency detector for detecting the reflected signal and a signal processing unit for processing the reflected signal, so as to identify the tuned resonant frequency of the RF coil and further configured for calculating return loss at the RF coil based on the reflected signal.

In another embodiment, a magnetic resonance imaging (MRI) system is provided. The MRI system comprises a radio frequency transmitter for transmitting a range of radio frequency signals through an object to be imaged, a radio frequency receiver operably coupled to the radio frequency transmitter for receiving the radio frequency signals transmitted through the object and a reconstruction processor coupled to the radio frequency receiver for reconstructing an image representation of the object from the signals received by the radio frequency receiver, to display on a human viewable display. Further, the radio frequency receiver comprises a RF coil. The RF coil comprises at least one digitally tunable capacitor and a communication controller unit configured to interface the at least one digitally tunable capacitor with an apparatus for automatically testing and tuning the RF coil.

In yet another embodiment, a method of testing a RF coil is provided. The method comprises steps of generating a stimulus comprising a range of radio frequency signals, applying the stimulus to the RF coil so as to enable the RF coil to generate a reflected signal, measuring return loss at the frequency of the applied stimulus based on the reflected signal and measuring transmit signal decoupling based on the reflected signal.

Systems and methods of varying scope are described herein. In addition to the aspects and advantages described in this summary, further aspects and advantages will become apparent by reference to the drawings and with reference to the detailed description that follows.

DETAILED DESCRIPTION OF THE INVENTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

Figure 1:
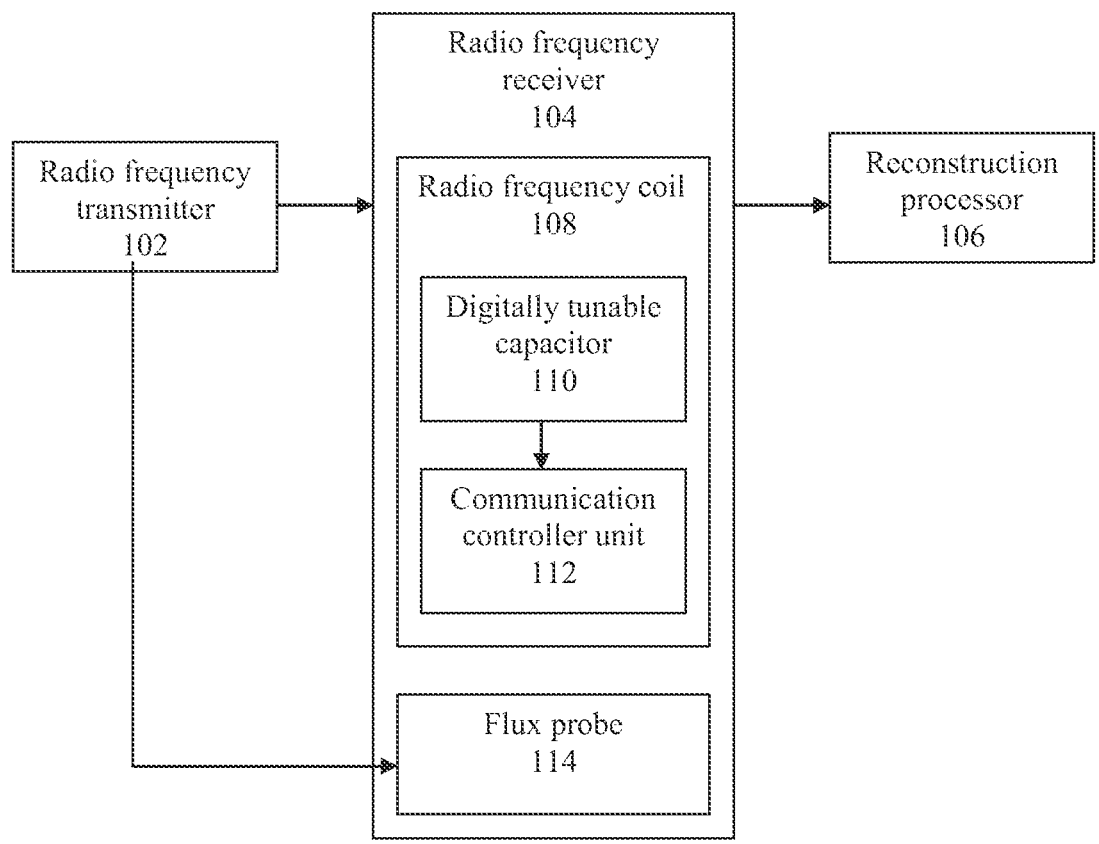
FIG. 1 shows a block diagram of a magnetic resonance imaging system as described in an embodiment.

In one embodiment, as shown in FIG. 1, a magnetic resonance imaging (MRI) system 100 is provided. The MRI system 100 comprises a radio frequency transmitter 102 (referred to hereafter as RF transmitter 102) for transmitting a range of radio frequency signals through an object to be imaged, a radio frequency receiver 104 (referred to hereafter as RF transmitter 104) for receiving the radio frequency signals transmitted through the object and a reconstruction processor 106 for reconstructing an image representation of the object from the signals received by the radio frequency receiver 104 to display on a human viewable display.

The radio frequency receiver 104 in the MRI system 100 comprises a radio frequency coil 108 (referred to hereafter as RF coil 108) for receiving one or more radio frequency signals transmitted through the object to be imaged so as to enable the reconstruction processor 106 to generate an image representation of the object based on the received radio frequency signals.

A typical MRI system 100 includes a bore for receiving the object to be imaged, a main magnet for applying a static magnetic field to the object to be imaged, and three gradient magnets for applying a gradient field in each of three Cartesian coordinates, x, y, and z, respectively. The MRI system 100 further comprises associated hardware and software for applying and pulsing magnetic and RF fields, in a manner known to those of skill in the art. During an imaging scan, the RF coil 108 is coupled around the object to be imaged. The object and associated RF coil 108 are subjected to a static magnetic field supplied by the main magnet, which causes alignment of nuclear spins of the atomic nuclei of hydrogen atoms in the object. The RF coil 108 is pulsed at a resonant frequency to provide RF excitation pulses to the object which effect precessional motion of the atomic nuclei at the characteristic Larmor frequency.

Typically, as noted above, the RF coil 108 of the radio frequency receiver 104 in the MRI system 100 is tuned to the Larmor frequency depending on the field strength of the magnet involved in the RF receiver 104. The RF coil 108 is required to exhibit high selectivity and minimum reflection at the Larmor frequency. However, the presence of an RF shield around the bore influences the resonant frequency of the RF coil 108 depending on the diameter of the bore and the distance of the RF coil 108 from the center of the bore.

The RF coil 108 is a resonant circuit comprising at least one inductive element and at least one capacitive element in series with the inductive element. The value of the inductive and the capacitive elements in the RF coil 108 determine the resonant frequency of the RF coil 108. Therefore, the resonant frequency of the RF coil 108 can be varied, in order to tune the RF coil 108 to the Larmor frequency, by varying at least one of the values of the inductive and the capacitive element that form the RF coil 108. With the advent of microelectronics, realization of digital control for parameters has been possible.

The inductive element is formed by a conductor and the inductance is determined by the length and width of the conductor forming the inductive element. The value of the inductive element therefore is typically constant. In order to achieve tunability, the capacitive elements in the RF coil 108 comprise combinations of fixed and variable capacitors. Accordingly, the capacitive element of the RF coil 108 comprises at least one fixed capacitor and at least one variable capacitor i.e., digitally tunable capacitor 110. Tunability of the RF coil 108 is achieved by digitally tuning the capacitance of the digitally tunable capacitor 110.

Further, in order to achieve tunability, the RF coil 108 houses a communication controller unit 112 coupled to the one or more digitally tunable capacitors 110. The communication controller unit 112 is configured for programming the one or more digitally tunable capacitors 110 of the RF coil 108. The communication controller unit 112 will be explained in detail in conjunction with FIG. 2.

Figure 2:
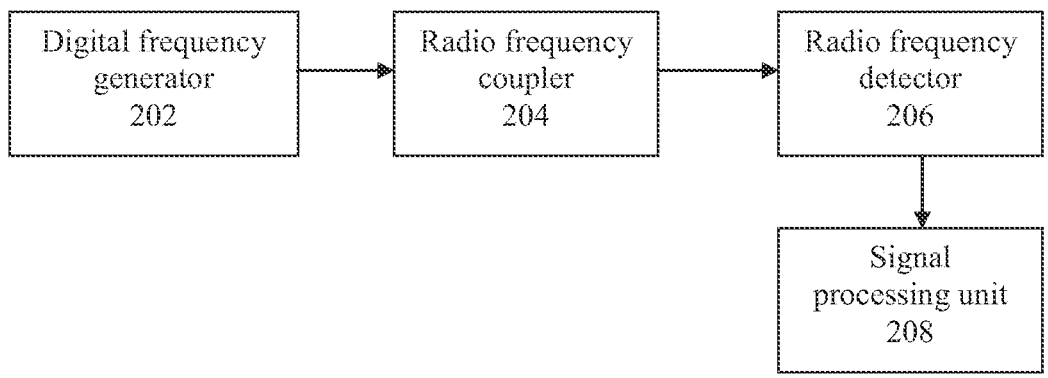
FIG. 2 shows a block diagram of an apparatus for automatically testing and tuning an RF coil used in the MRI system shown in FIG. 1, as described in an embodiment.

In FIG. 2, the invention, as described in one embodiment, provides an apparatus 200 for automatically testing and tuning an RF coil 108 that can be used in one or more MRI systems of varying specifications such as different field strength, bore diameter etc. The apparatus 200 for automatically testing and tuning the RF coil 108 is configured to automatically test the RF coil 108 by measuring the return loss and transmit signal decoupling and is further configured to digitally tune the resonant frequency of the RF coil 108 using a digital programming interface.

It may be noted that the RF coil 108 shown to be a part of the MRI system 100, can be used in any MRI system that is different from MRI system 100 in terms of field strength or bore diameter etc. The RF coil 108 when operably coupled to the apparatus 200 can be automatically and digitally tuned to the Larmor frequency of the MRI system 100 depending on the field strength of the main magnet involved in the MRI system 100.

Testing of the RF coil 108 involves measurement of two parameters return loss and transmit signal decoupling. Return loss is the logarithmic equivalent of reflection coefficient at the RF coil 108. The apparatus 200 for automatically testing and tuning the RF coil 108 comprises a digital frequency generator 202 and a combination of a radio frequency coupler 204 (referred to hereafter as RF coupler 204) and a radio frequency detector 206 (referred to hereafter as RF detector 206) configured to measure the return loss at the frequency of the exciting signal over the band of the frequency sweep. In one embodiment, the digital frequency generator 202 is a DSP based oscillator (sweep oscillator/local oscillator/programmable oscillator) and the RF detector 206 is a schottky diode 402.

The digital frequency generator 202 is configured for generating a stimulus, the stimulus comprising a range of radio frequency signals having different frequencies. The RF coupler 204 is configured for applying the stimulus to the RF coil 108 so as to enable the RF coil 108 to generate a reflected signal in response to the stimulus applied. The RF detector 206 is configured for detecting the reflected signal. The apparatus 200 further comprises a signal-processing unit 208 for processing the reflected signal, so as to identify the tuned resonant frequency of the RF coil 108. The signal-processing unit 208 is further configured for calculating return loss at the RF coil 108 based on the reflected signal.

Figure 3:
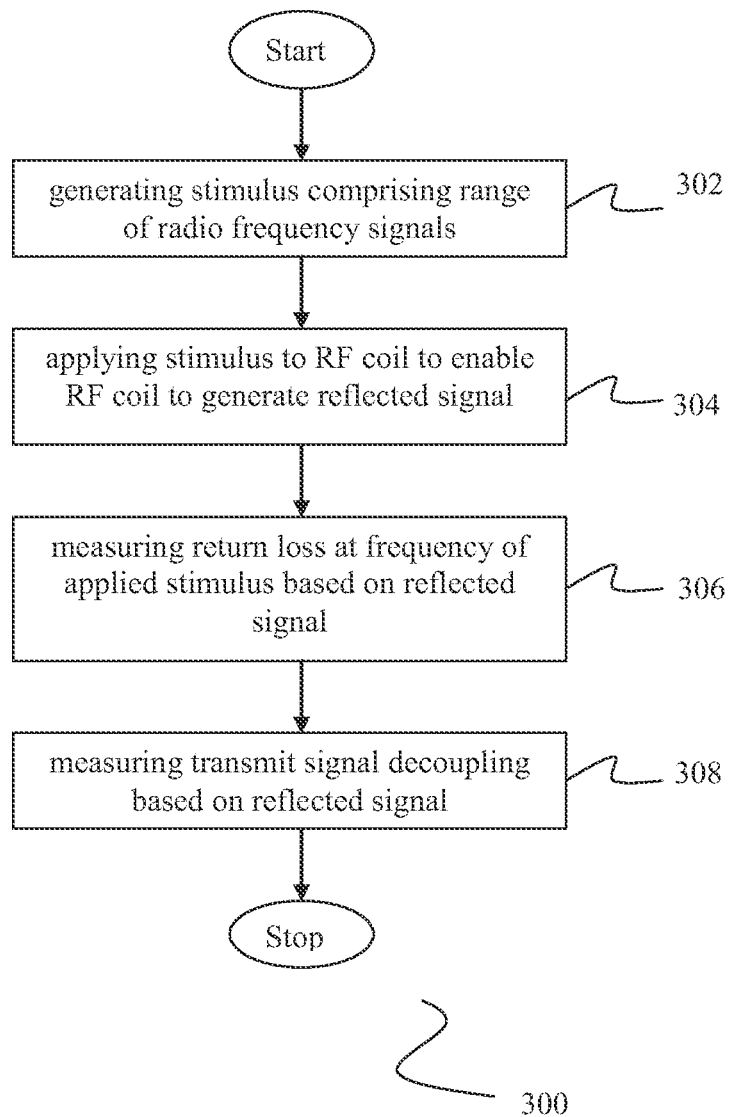
FIG. 3 shows a flow diagram depicting a method of automatically testing and tuning an RF coil, as described in an embodiment.

Accordingly, in one embodiment, as shown in FIG. 3, a method 300 of testing the RF coil 108 is described. The method 300 comprises steps of generating a stimulus comprising a range of radio frequency signals at step 302, applying the stimulus to the RF coil 108 so as to enable the RF coil 108 to generate a reflected signal at step 304, measuring return loss at the frequency of the applied stimulus based on the reflected signal at step 306 and measuring transmit signal decoupling based on the reflected signal at step 308.

Figure 4:
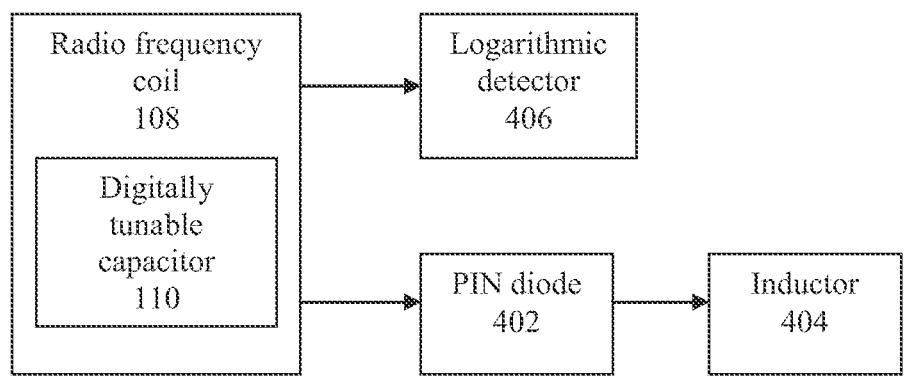
FIG. 4 shows a block diagram of a decoupling circuit described in one embodiment.
Figure 5:
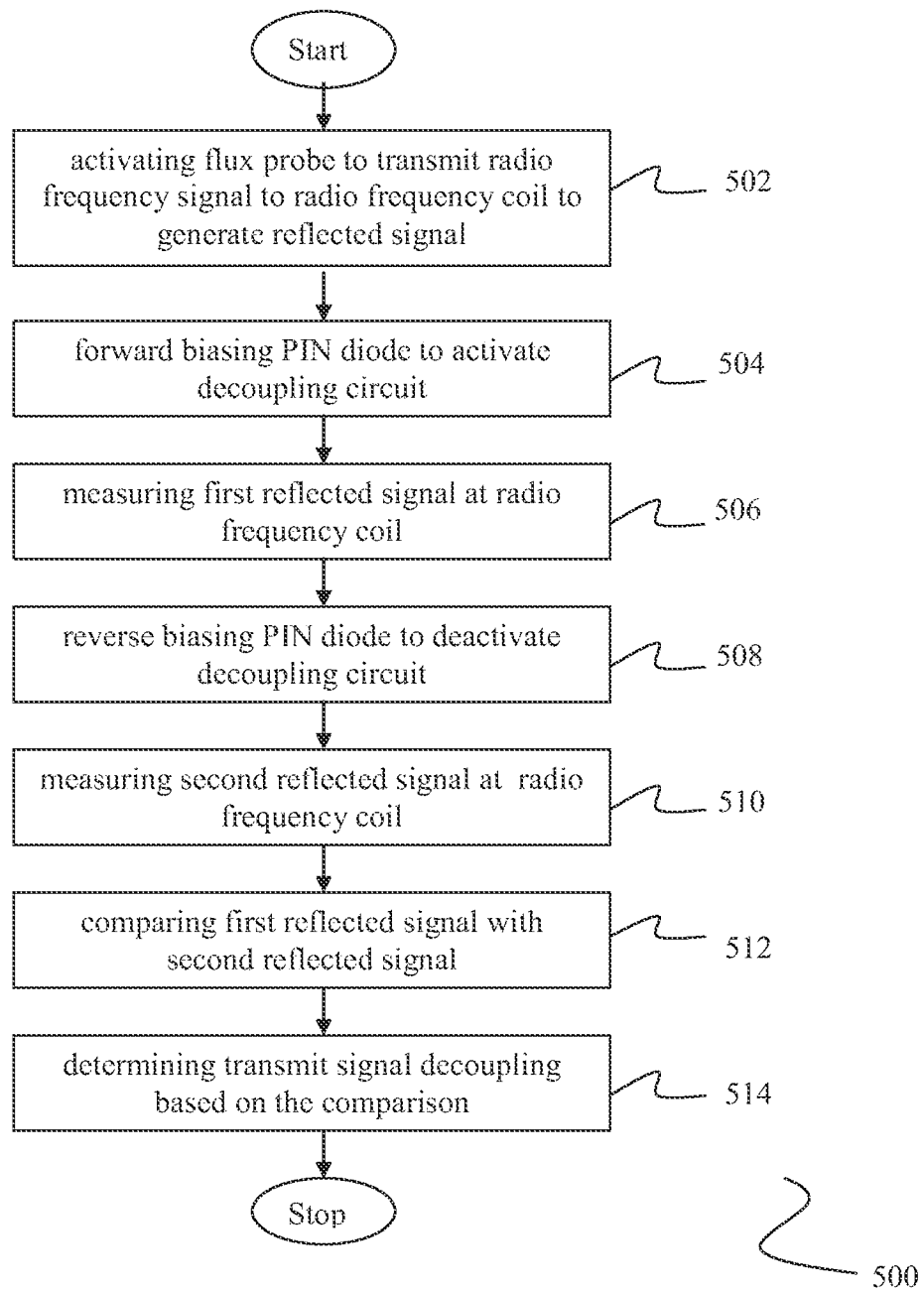
FIG. 5 shows a flow diagram of depicting a method of measuring transmit signal decoupling in an RF coil, as described in one embodiment.

The apparatus 200 further comprises a decoupling circuit for determining transmit signal decoupling between the radio frequency transmitter 102 and the radio frequency receiver 104. The decoupling circuit 400, as shown in FIG. 4, comprises a digitally tunable capacitor 110 forming a part of the RF coil 108, a PIN diode 402 connected in parallel to the digitally tunable capacitor 110, an inductor 404 connected in series with the PIN diode 402 and a logarithmic detector 406 coupled to the RF coil 108, the logarithmic detector 406 configured for measuring the output at the RE coil 108.

The decoupling circuit 400 is configured to block the RF signal flow in the RF coil 108, which forms a part of the RF receiver 104, during the application of the high power transmit pulse. The decoupling circuit 400 comprises a switched parallel resonant circuit coupled to the resonant circuit of the RF coil 108, as shown in FIG. 4. The switching is accomplished by the PIN diode 402, which forms a short circuit when the PIN diode 402 is forward biased and forms an open circuit in the absence of the forward bias.

The radio frequency receiver 104 further comprises a flux probe 114 coupled to the RF transmitter 102. The flux probe 114 is configured for applying the stimulus to the RF coil 108.

The apparatus 200 couples the flux probe 114 to the RF transmitter 102 so as to activate the flux probe 114 to transmit the radio frequency signal generated at the RF transmitter 102. The apparatus 200 is further configured to activate one or more DC bias lines connecting the PIN diode 402. The output signal at the RF coil 108 is detected by the logarithmic detector 406. In a first condition, the PIN diode 402 is forward biased thereby activating the decoupling circuit 400. In a second condition, the PIN diode 402 is reverse biased thereby de-activating the decoupling circuit 400. The difference in a first output signal and a second output signal, the first output signal representing the output of the RF coil 108 in the first condition and the second output signal representing the output of the RE coil 108 in the second condition, determines an isolation factor. Subsequently, the transmit signal decoupling is determined based on the isolation factor.

During the time in which the PIN diode 402 forms the short circuit, the digitally tunable capacitor 110 in the RF coil 108 connects in parallel with the inductor 404 (connected in series with the PIN diode 402) and forms a parallel resonant circuit at the Larmor Frequency there by providing a high impedance path to the RF transmit pulse in the RF coil 108. The impedance is approximately in the range of 2-3 kilo Ohms.

During the time in which the PIN diode 402 forms the open circuit, the impedance provided to the RF transmit pulse in the RF coil 108 is very low in the order of 2-3 Ohms. Therefore, measuring the RF output in the RF coil 108 provides an indication of the transmit signal decoupling that exists between the RF transmitter 102 and the RF receiver 104 in the MRI system 100.

Accordingly, a method of measuring transmit signal decoupling is provided. The method of measuring transmit signal decoupling based on the reflected signal comprises steps of coupling the flux probe 114 to the RF transmitter 102, activating the flux probe 114 to transmit at least one radio frequency signal to the RF coil 108 so as to generate a reflected signal, forward biasing the PIN diode 402 to activate the decoupling circuit 400, measuring a first reflected signal at the RF coil 108 using a logarithmic detector 406, reverse biasing the PIN diode 402 to deactivate the decoupling circuit 400, measuring a second reflected signal at the RF coil 108 using the logarithmic detector 406, comparing the first reflected signal with the second reflected signal and determining the transmit signal decoupling based on the comparison. The difference in the first reflected signal and the second reflected signal representing an isolation factor is compared to a predetermined value of the isolation factor. A condition where the value of the measured isolation factor equals or exceeds the stored predetermined value indicates a successful transmit signal decoupling between the RF transmitter 102 and the RF receiver 104.

Following the confirmation of the successful transmit signal decoupling between the RF transmitter 102 and the RF receiver 104 in the MRI system 100 the apparatus 200 tunes the resonant frequency of the RF coil 108 to a desired value.

As noted above, the resonant frequency of the RF coil 108 is determined by the value of the inductive element and the capacitive element that form the sensing loop. The capacitive element comprises a combination of fixed capacitors and digitally tunable capacitors 110. The value of the inductive element and that of the fixed capacitors is constant for the given RF coil 108 and therefore tunability of the RF coil 108 is achieved by digitally tuning the capacitance of the digitally tunable capacitor 110.

The value of the fixed capacitors is obtained from a coil 108 configuration file. The coil 108 configuration file for a given RF coil 108 may contain the value of the total loop inductance, fixed capacitance and the capacitance control information. The apparatus 200 may perform a probing scan to determine the peak in the spectrum. The peak in the spectrum represents the resonant frequency of the RF coil 108. Accordingly, a method of determining the resonant frequency of the RF coil 108 is provided. The method comprises steps of generating a stimulus using the digital frequency generator 202, applying the stimulus to the RF coil 108 using the RF coupler 204 so as to enable the RF coil 108 to generate a reflected signal in response to the stimulus applied, detecting the reflected signal using the RF detector 206 and processing the reflected signal, using the signal-processing unit 208, in order to identify the tuned resonant frequency of the RF coil 108. The resonant frequency is the frequency at which energy transfer into the RF coil 108 is maximized. Further, the maximum energy transfer into the RF coil 108 is determined by minimum amplitude of the reflected signal received from the RF coil 108.

The range of radio frequency signals generated by the digital frequency generator 202 comprise a first limit and a second limit. The first limit is about 5 MHz below the Larmor frequency and the second limit is about 5 MHz above the Larmor frequency. The radio frequency signals generated by the digital frequency generator 202 approximately have constant amplitude. The stimulus comprising the range of radio frequency signals generated by the digital frequency generator 202 is applied through the radio frequency (directional) coupler 204 (typically 20 dB coupling) to the RF coil 108 under test. The coupled reflected signal is detected by the RF detector 206, digitized by the analog-to-digital converter (ADC) and fed to the digital processing unit.

The digital processing unit records the reflected magnitude of the RF signal for each frequency in the sweep (typically with a step of 10 kHz). The frequency at which the RF coil 108 is tuned corresponds to the frequency at which the reflected signal is at a minimum.

As described above, peak in the spectrum represents the frequency at which the RF coil 108 is tuned. The peak may appear at a frequency above or below the Larmor frequency depending on the field strength or the bore diameter of the MRI system 100, which is going to incorporate the RF coil 108. In order to tune the RF coil 108 to the Larmor frequency, the capacitance needs to be increased or decreased proportional to the difference in the actually tuned frequency and the Larmor frequency.

In an exemplary embodiment, the RF coil 108 is tuned to a resonant frequency 'fa' which is slightly above the Larmor frequency 'fe'. Considering "L" to be the value of the inductive element in the RF coil 108, the resonant frequency fa is equal to $1/(2*pi*sqrt(L*Ca))$ where Ca is the value of the capacitive element in the RF coil 108 at the resonant frequency 'fa'. The Larmor frequency fc is equal to $1/(2*pi*sqrt(L*Cc))$ where Cc is the value of the capacitive element in the RF coil 108 at the Larmor Frequency 'fc'.

The values of the fixed capacitors are obtained from the coil 108 configuration file. The tuned value of the digitally tunable capacitor 110 is read through a digital serial configuration word. The value of the capacitive element "Ca" is equal to the series combination of the fixed capacitor and the digitally tunable capacitor 110.

A desired value for the digitally tunable capacitor 110 may be calculated based on the value of the fixed capacitors, the tuned value of the digitally tunable capacitor 110 and the tuned resonant frequency of the RF coil 108. The desired value for the digitally tunable capacitor 110 represents the value of the digitally tunable capacitor 110 corresponding to the Larmor frequency.

The desired value is programmed into the digitally tunable capacitor 110 by the communication controller unit 112 using a digital programming interface. The digital programming interface is a three wire serial interface that uses a communication protocol depending on the compatibility of the communication controller unit 112. The communication protocol is one of inter IC bus and Serial Peripheral Interface bus. Skilled artisans shall however appreciate the use of other compatible communication protocols. This desired value programmed into the digitally tunable capacitor 110 may tune the resonant frequency of the RF coil 108 to the Larmor frequency.

Figure 6:
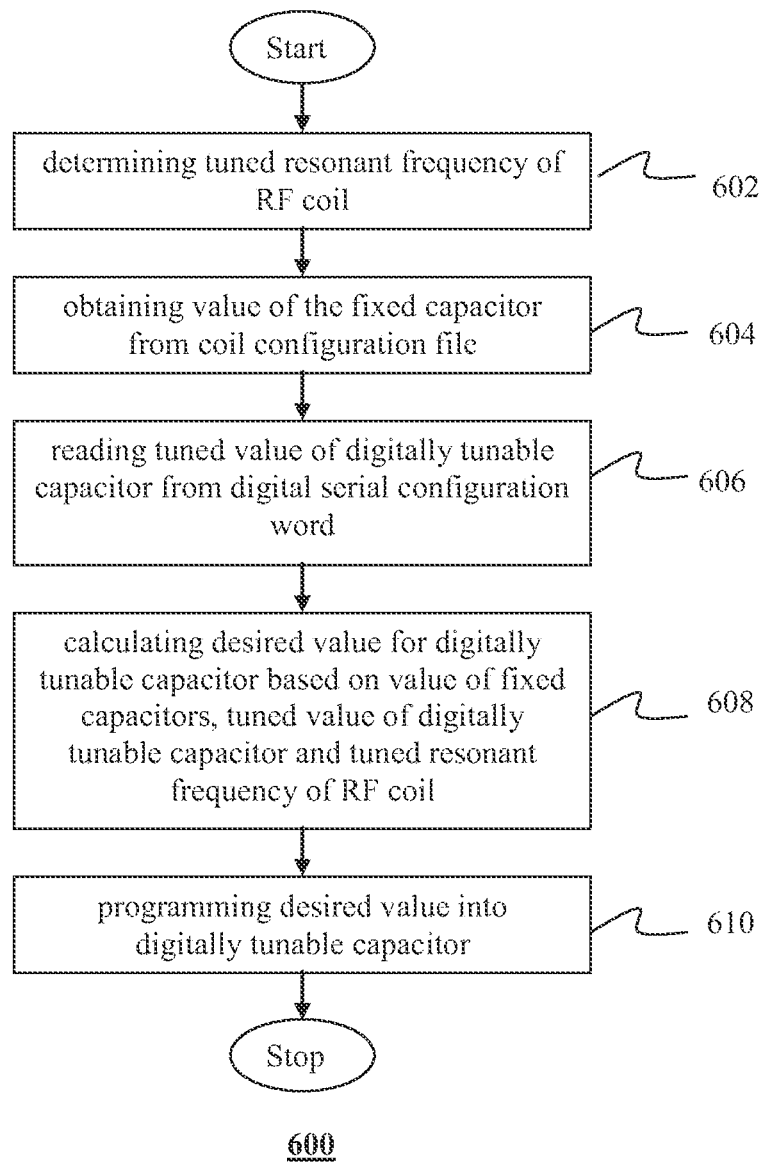
FIG. 6 shows a flow diagram depicting a method of tuning the resonant frequency of an RF coil, as described in one embodiment.

Accordingly, in another embodiment, as shown in FIG. 6, a method 600 of tuning the RF coil 108 is provided. The method 600 is performed by the apparatus 200 and comprises steps of determining tuned resonant frequency of the RF coil 108 at step 602, obtaining value of the at least one fixed capacitor from the coil 108 configuration file at step 604, reading tuned value of the digitally tunable capacitor 110 from the digital serial configuration word at step 606, calculating a desired value for the digitally tunable capacitor 110 based on the value of the fixed capacitors, the tuned value of the digitally tunable capacitor 110 and the tuned resonant frequency of the RF coil 108 at step 608, and programming the desired value into the digitally tunable capacitor 110 at step 610.

In an alternative embodiment, the RF transmitter 102 may comprise an RF generator 202 that generates a range of RF signals having different frequencies. The output of the RF generator 202 may be coupled (prior to power amplification) to the flux probe 114 that can be fixed at the center of the bore by means of a cardboard fixture. The flux probe 114 may then apply the stimulus to the RF coil 108. The stimulus may subsequently be reflected by the RF coil 108. The frequency of the RF generator 202 is swept over a range and the amplitude of the RF signal reflected from the RF coil 108 is detected and stored. The frequency of the RF signal at which the amplitude of the reflected signal from the RF coil 108 is minimum implies the frequency "fa" at which the RF coil 108 is tuned. This information may be used to tune the REF coil 108 to the desired resonant frequency "fc" from the knowledge of "fa", inductance "L" and fixed capacitance "Cf" as explained above.

The method 600 of tuning the RF coil 108 described herein is efficient as the tunable element is digital unlike the varactor diode 402 used in the prior art that is more susceptible to noise and has lower temperature stability.

Further, digital tunability may be incorporated in new or existing RF coils by replacing the manually adjustable trimmer capacitors with one or more digitally tunable capacitors 110 and providing digital i/o lines for programming. In one exemplary embodiment, MEMS and CMOS based digitally tunable capacitors 110 may be employed.

The following example illustrates a communication methodology that may be used.

In a scenario where an RF coil 108 having four channels is to be tuned, each channel comprising two digitally tunable capacitors 110, the tuning step of the capacitance is fixed at 0.5 pF and the minimum capacitance is fixed at 4 pF.

Further, in a condition where the first capacitor of the fourth channel needs to be tuned to 6 pF and the second capacitor of fourth channel needs to be tuned to 5 pF, the minimum capacitance value and the tuning characteristics are obtained from the coil 108 configuration file.

6 pF implies 2 pF above the minimum capacitance of 4 pF. With a tuning step of 0.5 pF, 4 steps would be needed to increase the capacitance by 2 pF. Similarly to set 5 pF, 2 steps would be required. This may be communicated from the apparatus 200 to the RF coil 108 in the following data format. However, other data formats and communication protocols can also be used.

Byte 0: Header: 0XEE
Byte1: Channel Number: 0X04; this implies channel 4.
Byte2: Tuning Steps for digital Cap 1: 0X04; this implies 4 steps for digital capacitor 1
Byte3: Tuning Steps for digital Cap 2: 0X02; this implies 2 steps for digital capacitor 2
Byte 4: Footer: 0XFF
Byte 5: Checksum: Binary bitwise sum of Bytes 0 to 4 and carry neglected.

The communications controller unit 112 may receive the digital serial configuration word sent by the apparatus 200. The digital serial configuration word comprises the configuration data for tuning the digitally tunable capacitors 110. The communication controller unit 112 is configured to re-transmit the data to an appropriate capacitor on the intended channel through its wired data lines. In case of an SPI interface, the clock and data lines may be made common to all the digital capacitors in the RF coil 108. The data latch/enable line may be made individual so as to latch the data on to the appropriate capacitor.

The high impedance of the resonant circuit in the RF coil 108 is subsequently matched to a predetermined system impedance (approximately 50 ohms) at the resonant frequency. Achievement of resonance and impedance match involves tuning the values of the inductive element and the capacitive element in the RF coil 108 such that the resonant frequency of the RF coil 108 equals the Larmor frequency "fc".

The apparatus 200 further comprises a user interface for providing a selection of the values for one or more parameters, the parameters comprising one or more values of the RF coil 108. In an exemplary embodiment the value may comprise the field strength of the MRI system 100 that is selected to incorporate the RF coil 108, selection of coil 108 and inductance. The user interface is one of a PC interface, touch screen interface and a keypad.

The apparatus 200 further comprises a memory interface coupled to the user interface. The memory interface is configured for storing the values of one or more parameters.

In one embodiment, the signal-processing unit 208 comprises an analog to digital converter coupled to the RF detector 206 and a digital processing unit coupled to the analog to digital converter. The analog to digital converter is configured for digitizing the reflected signal and the digital processing unit is configured for processing the reflected signal so as to identify the resonant frequency of the RF coil 108 and further to determine the return loss at the RF coil 108 based on the reflected signal.

In an alternative embodiment, a direct digital synthesizer (DDS) based programmable oscillator may be used in combination with a microcontroller unit for signal generation and data processing. The direct digital synthesizer may be coupled to the RF detector 206 and configured for modifying the reflected signal. Further, the microcontroller unit coupled to the direct digital synthesizer may be configured for processing the reflected signal.

Some of the advantages of the apparatus 200 for automatically tuning and testing the RF coil provided herein include, elimination of repetitive and/or iterative manual tuning process in various bore conditions, digital tuning performed on the basis of capacitance calculated from probe scan or real time spectrum analysis, a single digital tuning cycle is to be performed thereby causing significant reduction in tuning time, increased accuracy in tuning, compatibility over various bore sizes with the same field strength, robust architecture, high reliability, repeatability and ease of production, elimination of periodic calibration process due to self-calibrating capability, reduction in the need for manual data analysis by a significant factor, suitable for mass testing and tuning in production phase and availability of electronic record of tuning data.

In various embodiments of the invention, an apparatus and method for automatically testing and tuning a RF coil are described. However, the embodiments are not limited and may be implemented in connection with different applications. The application of the invention can be extended to other areas, for example imaging systems. The design can be carried further and implemented in various forms and specifications.

This written description uses examples to describe the subject matter herein, including the best mode, and also to enable any person skilled in the art to make and use the subject matter. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An apparatus for automatically testing and tuning a RF coil, the apparatus comprising:
    a digital frequency generator for generating a stimulus, the stimulus comprising a range of radio frequency signals having different frequencies, the range of frequency signals comprising a first limit and a second limit, the first limit being above a Larmor frequency for the RF coil and the second limit being below the Larmor frequency;
    a radio frequency coupler configured for applying the stimulus to the RF coil so as to enable the RF coil to generate a reflected signal in response to the stimulus applied;
    a radio frequency detector for detecting the reflected signal; and
    a signal processing unit for processing the reflected signal, so as to identify the tuned resonant frequency of the RF coil and further configured for calculating return loss at the RF coil based on the reflected signal, the tuned resonant frequency corresponding to the frequency at which the reflected signal is at a minimum.

2. The apparatus of claim 1, wherein the RF coil comprises: one or more digitally tunable capacitors; and
    a communication controller unit for programming the one or more digitally tunable capacitors of the RF coil.

3. The apparatus of claim 2, wherein the communication controller unit communicates with the one or more digitally tunable capacitors using digital i/o lines.

4. The apparatus of claim 2, wherein the communications controller unit is configured to interface the apparatus with the one or more digital capacitors.

5. The apparatus of claim 1, further comprises a decoupling circuit for determining transmit signal decoupling between a radio frequency transmitter and a radio frequency receiver, the decoupling circuit comprising:
    a digitally tunable capacitor forming a part of the RF coil;
    a PIN diode connected in parallel to the digitally tunable capacitor;
    an inductor connected in series with the PIN diode; and
    a logarithmic detector coupled to the RF coil, the logarithmic detector configured for measuring the output at the RF coil.

6. The apparatus of claim 1, further comprises a flux probe coupled to the digital frequency generator, the flux probe configured to apply at least one radio frequency signal to the RF coil.

7. The apparatus of claim 1, further comprises a user interface for providing a selection of the values for one or more parameters, the parameters comprising one or more values of the RF coil.

8. The apparatus of claim 7, wherein the user interface is one of a PC interface, touch screen interface and a keypad.

9. The apparatus of claim 7, further comprises a memory interface coupled to the user interface, the memory interface configured for storing the values of one or more parameters.

10. The apparatus of claim 1, wherein the signal processing unit comprises:
    an analog to digital converter coupled to the radio frequency detector, the analog to digital converter configured for digitizing the reflected signal; and
    a digital processing unit coupled to the analog to digital converter, the digital processing unit configured for processing the reflected signal.

11. The apparatus of claim 1, wherein the signal processing unit comprises:
    a direct digital synthesizer coupled to the radio frequency detector, the direct digital synthesizer configured for modifying the reflected signal; and
    a microcontroller unit coupled to the direct digital synthesizer, the microcontroller unit configured for processing the reflected signal.

12. The apparatus of claim 1, wherein the radio frequency detector is a schottky diode.

13. A magnetic resonance imaging system comprising:
    a radio frequency transmitter for transmitting a range of radio frequency signals through an object to be imaged;
    a radio frequency receiver operably coupled to the radio frequency transmitter for receiving the radio frequency signals transmitted through the object and wherein the radio frequency receiver comprises a RF coil; and
    a reconstruction processor coupled to the radio frequency receiver for reconstructing an image representation of the object from the signals received by the radio frequency receiver to display on a human viewable display;
    wherein the RF coil comprises at least one digitally tunable capacitor and a communication controller unit configured to interface the at least one digitally tunable capacitor with an apparatus for automatically testing and tuning the RF coil,
    wherein the apparatus comprises:
        a digital frequency generator for generating a stimulus, the stimulus comprising a range of radio frequency signals having different frequencies, the range of frequency signals comprising a first limit and a second limit, the first limit being above a Larmor frequency for the RF coil and the second limit being below the Larmor frequency;
        a radio frequency coupler configured for applying the stimulus to the RF coil so as to enable the RF coil to generate a reflected signal in response to the stimulus applied;
        a radio frequency detector for detecting the reflected signal; and
        a signal processing unit for processing the reflected signal, so as to identify the tuned resonant frequency of the RF coil and further configured for calculating return loss at the RF coil based on the reflected signal, the tuned resonant frequency corresponding to the frequency at which the reflected signal is at a minimum.

14. A method of testing a RF coil, the method comprising:
generating a stimulus comprising a range of radio frequency signals, the range of frequency signals comprising a first limit and a second limit, the first limit being above a Larmor frequency for the RF coil and the second limit being below the Larmor frequency;
applying the stimulus to the RF coil so as to enable the RF coil to generate a reflected signal;
measuring return loss at the frequency of the applied stimulus based on the reflected signal; and
measuring transmit signal decoupling based on the reflected signal.

15. The method of claim 14, wherein measuring transmit signal decoupling based on the reflected signal comprises:
activating a flux probe to transmit at least one radio frequency signal to the RF coil so as to generate a reflected signal;
forward biasing a PIN diode to activate the decoupling circuit;
measuring a first reflected signal at the RF coil using a logarithmic detector;
reverse biasing the PIN diode to deactivate the decoupling circuit;
measuring a second reflected signal at the RF coil using the logarithmic detector;
comparing the first reflected signal with the second reflected signal; and
determining the transmit signal decoupling based on the comparison.

* * * * *